(12) United States Patent
Ali et al.

(10) Patent No.: US 7,075,179 B1
(45) Date of Patent: Jul. 11, 2006

(54) SYSTEM FOR IMPLEMENTING A CONFIGURABLE INTEGRATED CIRCUIT

(75) Inventors: Anwar Ali, San Jose, CA (US); Julie L. Beatty, Campbell, CA (US); Kalyan Doddapaneni, Mt. View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/016,014

(22) Filed: Dec. 17, 2004

(51) Int. Cl.
*H01L 23/48* (2006.01)
*H01L 23/485* (2006.01)
*H01L 23/50* (2006.01)
*H01L 23/552* (2006.01)

(52) U.S. Cl. .............. 257/691; 257/E23.114; 257/E23.02; 257/E23.07; 257/E23.079; 257/773; 257/698; 257/784; 257/786; 257/774; 361/704; 361/719; 361/761; 361/764; 361/774; 716/1; 716/5; 716/8; 716/10; 716/11; 356/56

(58) Field of Classification Search ........ 257/690–693, 257/696, 698, 668, 676, 784, 786, 664, 700, 257/701, 758, 773, E23.114, E23.02, E23.07, 257/E23.079; 361/704, 719, 761, 764, 774
See application file for complete search history.

(56) References Cited

U.S. PATENT DOCUMENTS

| | | | | |
|---|---|---|---|---|
| 4,731,643 A | * | 3/1988 | Dunham et al. ............ 257/203 |
| 5,801,440 A | * | 9/1998 | Chu et al. .................... 257/691 |
| 5,864,470 A | * | 1/1999 | Shim et al. ................. 361/777 |
| 6,477,046 B1 | * | 11/2002 | Stearns et al. .............. 361/704 |
| 6,516,447 B1 | * | 2/2003 | Wadland et al. ............... 716/1 |
| 6,674,646 B1 | * | 1/2004 | Golshan et al. ............ 361/760 |
| 6,721,933 B1 | * | 4/2004 | Iwasa .......................... 716/10 |
| 6,747,349 B1 | * | 6/2004 | Al-Dabagh et al. ......... 257/691 |
| 6,770,963 B1 | * | 8/2004 | Wu .............................. 257/691 |
| 6,897,555 B1 | * | 5/2005 | Lim et al. .................... 257/692 |
| 2001/0011768 A1 | * | 8/2001 | Kohara et al. .............. 257/692 |
| 2002/0056857 A1 | * | 5/2002 | Iwasa .......................... 257/203 |
| 2003/0160294 A1 | * | 8/2003 | Wu et al. .................... 257/459 |
| 2004/0120128 A1 | * | 6/2004 | Chang ......................... 361/764 |
| 2004/0212040 A1 | * | 10/2004 | Sano ........................... 257/532 |
| 2005/0024800 A1 | * | 2/2005 | Zecri et al. ................... 361/56 |
| 2005/0121753 A1 | * | 6/2005 | Lee et al. .................... 257/666 |
| 2005/0263861 A1 | * | 12/2005 | Ahn et al. ................... 257/666 |

FOREIGN PATENT DOCUMENTS

JP          2003-179177      *  6/2003

* cited by examiner

*Primary Examiner*—Alexander Oscar Williams
(74) *Attorney, Agent, or Firm*—Strategic Patent Group

(57) ABSTRACT

The present invention provides a system for implementing a configurable integrated circuit (IC). Aspects of the invention include an IC die; a plurality of input/outputs (I/Os) coupled to the IC die; and a plurality power planes coupled to the IC die for providing power to the plurality of I/Os at different voltages. The plurality of power planes are configured concentrically around the IC die so that any one or more of the I/Os at any location on the IC die can be individually configured to connect to any of the power planes. As a result, any number of I/Os available on the IC die can operate at a given voltage.

10 Claims, 4 Drawing Sheets

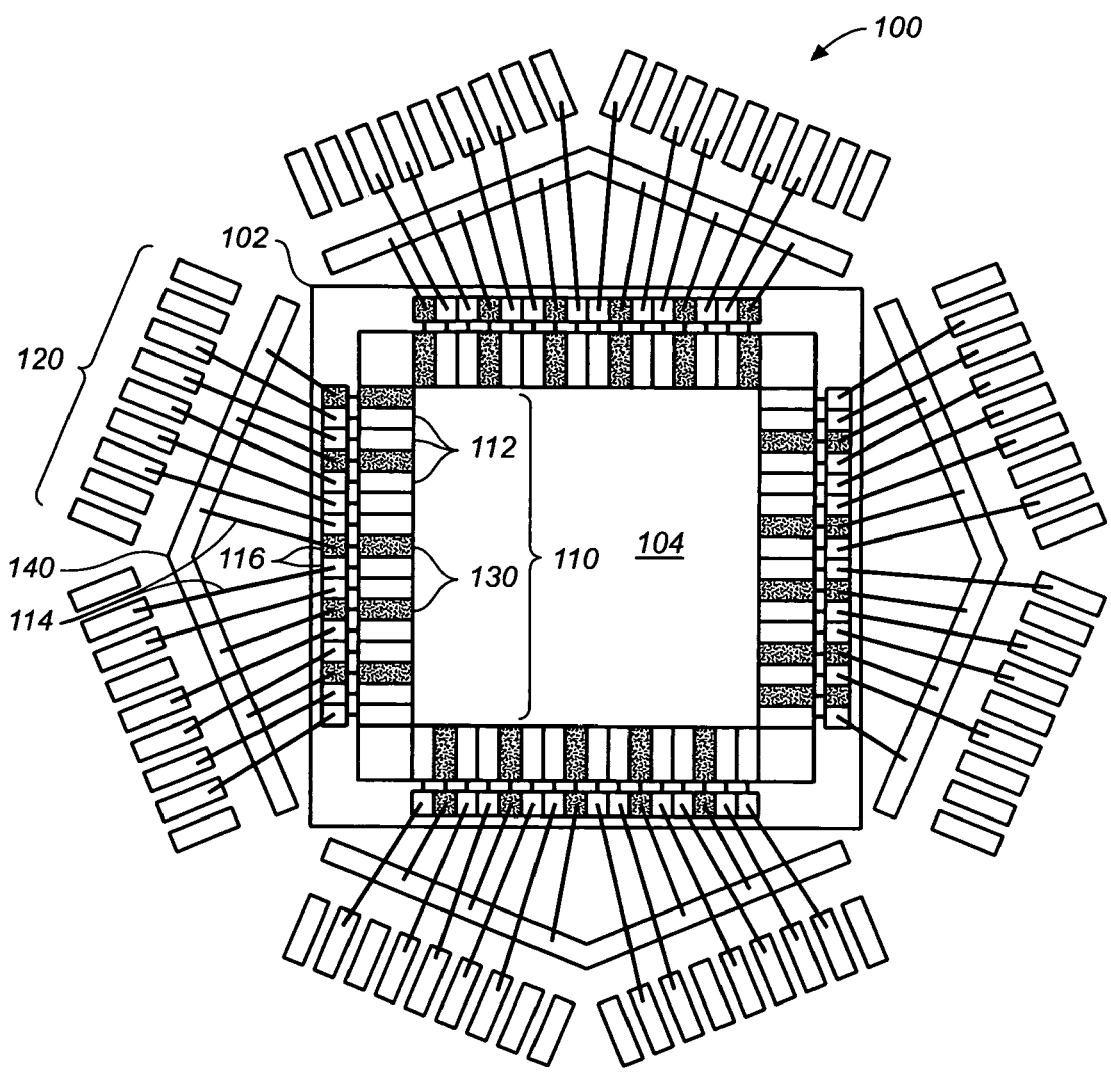
FIG._1
*(PRIOR ART)*

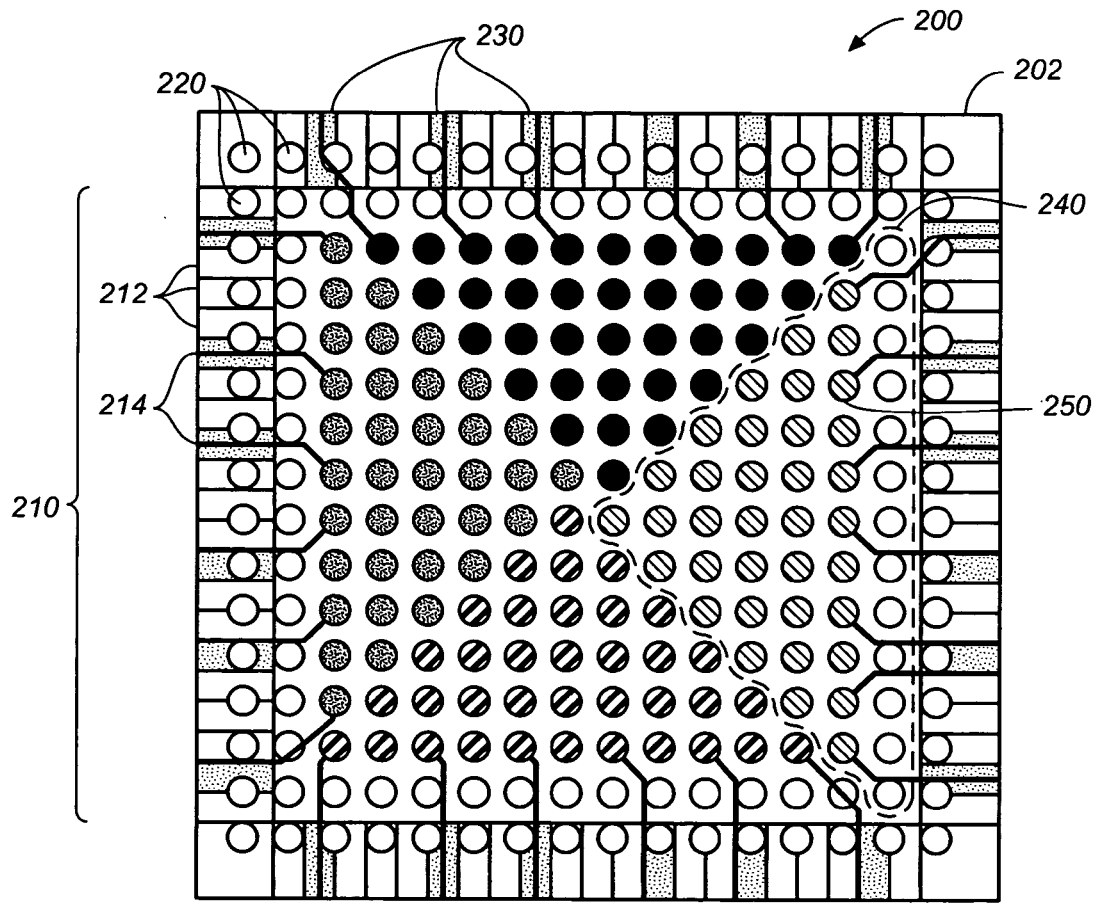
FIG._2
*(PRIOR ART)*

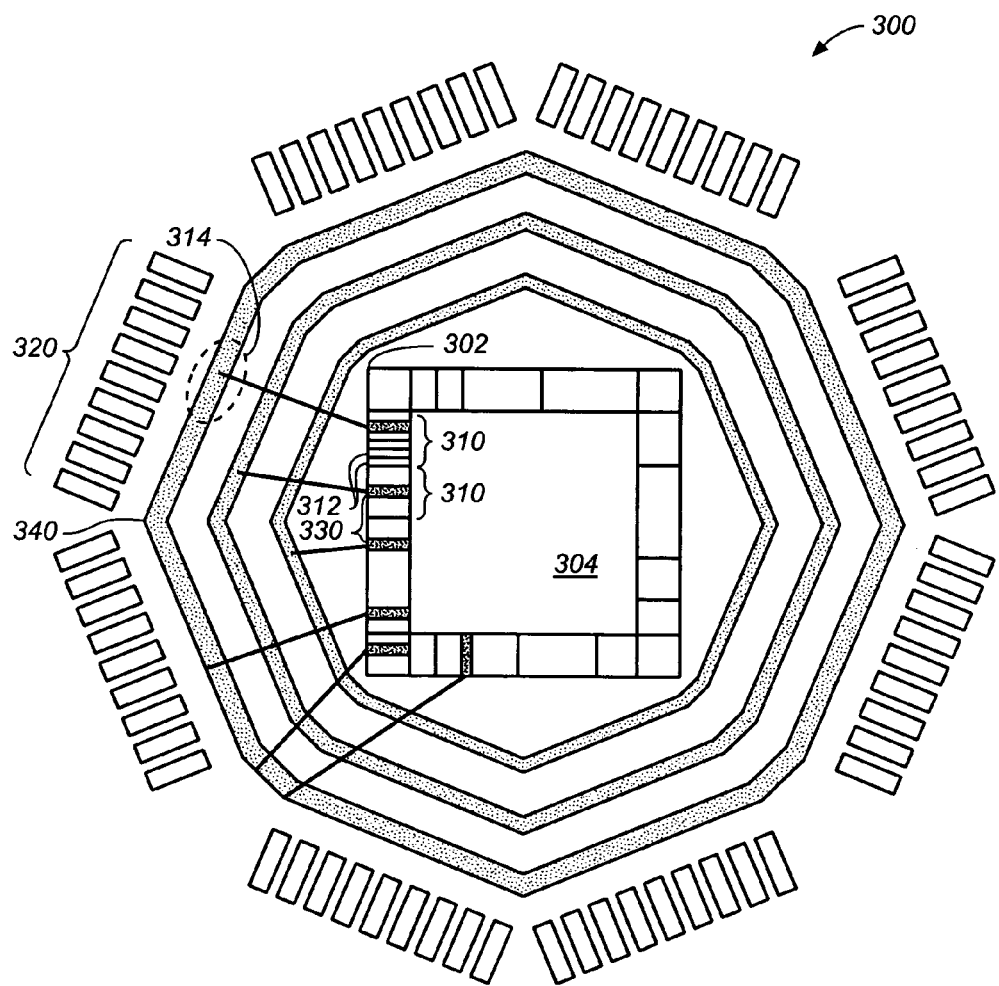
FIG._3

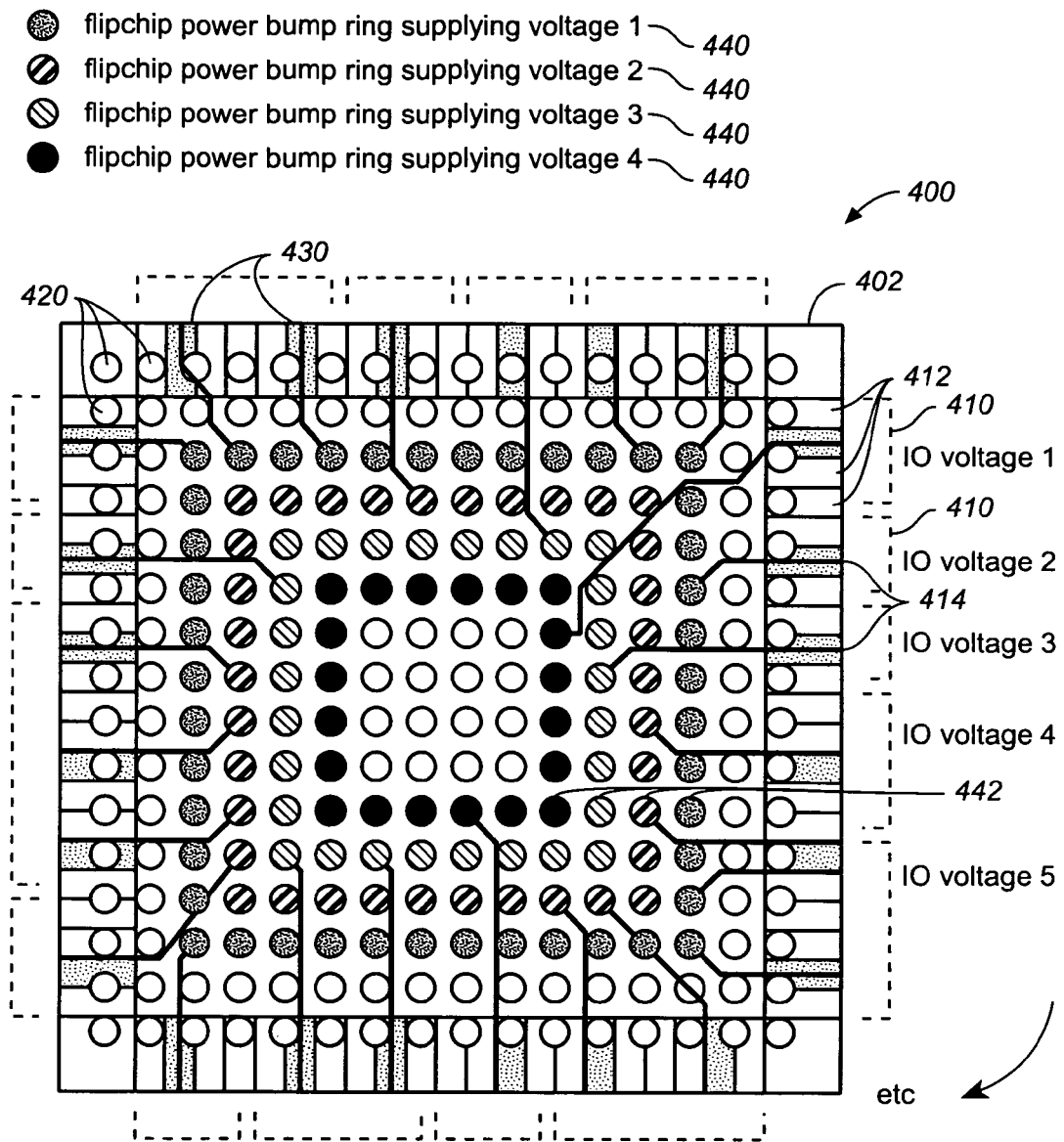
FIG._4

SYSTEM FOR IMPLEMENTING A CONFIGURABLE INTEGRATED CIRCUIT

FIELD OF THE INVENTION

The present invention relates to semiconductor devices, and more particularly to a system for implementing a configurable integrated circuit.

BACKGROUND OF THE INVENTION

Configurable semiconductor devices allow chip designers to configure input/output devices (hereinafter, I/Os) during metallisation or programming steps. Examples of configurable semiconductor devices include rapid chips and field programmable devices. A rapid chip is a fixed and pre-diffused semiconductor device, which is later metalized in different configurations according to a specific application and according to user requirements. Limited layers may also be fixed. A field programmable device is a semiconductor device having logic blocks of gate arrays. Field programmable devices, which may also be pre-diffused, are configured with software or metalized to perform various functions according to a specific application and according to user requirements.

Before a pre-diffused semiconductor device is metalized with metal traces or wire bonds, it is referred to as a "slice." Certain metal layers may also be fixed in the slice. After a slice is metalized, it is referred to as an "instance."

Configurable semiconductor devices provide silicon re-usability across many different applications, using configurable I/Os, which can be configured during the creation of an instance to perform different functions and to operate at different operating voltages that may be required by each distinct application.

Semiconductor devices are implemented with various types of packages such as wirebond packages and flip chip packages, both of which are described below. FIG. 1 is a diagram of a conventional wirebond package 100. The wirebond package 100 includes an integrated circuit (IC) die (hereinafter, die 102), core logic 104, I/O segments 110, I/Os 112, pad wires 114, bond pads 116, signal fingers 120, power connections 130, and power planes 140.

During a configuration operation, the I/Os 112 are configured to interface the core logic 104 with the environment external to the wirebond package 100. Examples of external environments include application-specific standard product (ASSP) environment or an application-specific integrated circuit (ASIC). The pad wires 114 and bond pads 116 connect the I/Os 112 to the signal fingers 120, and to the power planes 140. The signal fingers 120 connect the I/Os 112 to signals or to discrete power in the external environment.

The I/Os 112 are also configured to operate at certain operating voltages (e.g. 1.2V, 1.5V, 2.5V, and 3.3V) by being connected via a metal trace or bond wire 114 to one of the power planes 140 depending on the required voltage.

Each power plane 140 is dedicated to supplying a unique operating voltage to a particular I/O segment 110. The I/O segments 110 are typically located around the die perimeter, and each I/O segment 110 is connected to the power plane 140 that is the closest in proximity. This simplifies the routing of the wire bonds 114. Also, the lengths of the wire bonds 114 should be minimized to reduce power noise.

The number of I/O segments 110 corresponds to the number of power planes 140, which is typically the same number of potentially required operating voltages. For example, if there are potentially four operating voltages required, there will be four available power planes 140. Accordingly, the I/Os 112 will be partitioned into four I/O segments 110.

The I/O segments 110 each have the same number of I/Os 112, because it is unknown how many I/Os 112 will be required by a particular application to operate at a particular voltage. Accordingly, the maximum number of available I/Os 112 that could be configured for a given operating voltage is a direct function of the number of power planes 140 in the wirebond package 100. If the total number of I/Os 112 is evenly allocated to the existing I/O segments 110, there should be, in principle, a sufficient number of I/Os 112 that can be configured for a given voltage requirement.

A problem with this conventional solution is that there is a pre-defined number of I/Os 112 per I/O segment 110. Consequently, this limits the number of I/Os 112 that can be supplied with a unique operating voltage. Consider the following example. A total of 44 configurable I/Os 112 exist on the die 102. However, the number of available voltages is limited by the number of power planes 140. Since there are only four power planes 140, there are only four available voltages. Accordingly, 11 I/Os may be configured for a voltage A, 11 I/Os may be configured for a voltage B, 11 I/Os may be configured for voltage C, and 11 I/Os may be configured for a voltage D.

Assume a particular application requires 44 I/O signals. In principle, the wirebond package 100 should suffice. However, the application may require more I/Os 112 than are available in a given I/O segment 110 of the wirebond package 100. For example, 9 I/Os may require voltage A, 14 I/Os may require voltage B, 6 I/Os may require voltage C, and 15 I/Os may require voltage D. Accordingly, the wirebond package 100 would not suffice. To suitably meet these constraints, a different wirebond package slice must be chosen. Such a slice will require a larger population of configurable I/Os (i.e. at least 15 available I/Os per voltage plane). Additionally, a larger package and package body size will be necessary as a result of using the larger-populated slice. Consequently, this increases the cost of the die and the package, and increases the package body size, which will have to be accommodated for at the system level.

Another problem with the conventional solution is that if only some of the I/Os 112 in a given I/O segment 110 is required for a given operating voltage, the remaining unused I/Os 112 in that I/O segment 110 becomes wasted. Consequently, instance designers are not able to fully benefit from the configurable nature the I/Os 112.

Yet another problem with the conventional solution is that the effective locations of the I/Os 112 that must operate at a particular voltage are fixed to a particular I/O segment 110. Consequently, signals routed on a circuit board using the wirebond package 100 are forced to connect to specific I/O segments 110. This significantly restriction a board layout in terms of the configurable devices interacting with other semiconductor devices on or off the board. This also requires an extensive co-design effort to ensure that the I/O segments 110 on the die 102 are aligned with the power planes 140.

Yet another problem is that the number of power planes 140 that can be designed into the wirebond package 100 is limited due to space. Since there are a finite number of power planes 140, the number of I/O segments 110 is limited, and thus the number of I/Os 112 that can be configured for a particular operating voltage is limited.

FIG. 2 is a diagram of a conventional flipchip package 200. The flipchip package 200 includes a die 202, I/O segments 210, I/Os 212, metal traces 214, signal bumps 220, power connections 230, power planes 240, and power bumps 250. During a configuration operation, the I/Os 212 are configured to interface core logic (not shown) with the environment external to the flipchip package 200. The signal bumps 220 connect the I/Os 212 to signals or to discrete power in the external environment.

The I/Os 212 are also configured to operate at certain operating voltages by being connected via the metal traces 214 to one of the power planes 240 depending on the required voltage. Each power plane 240 is dedicated to supplying a unique operating voltage to a particular I/O segment 210. The I/O segments 210 are typically located around the die perimeter, and each I/O segment 210 is connected to the power plane 240 that is the closest in proximity.

The number of I/O segments 210 corresponds to the number of power planes 240, which is typically the same number of potentially required operating voltages. The I/O segments 210 each have the same number of I/Os 212, because it is unknown how many I/Os 212 will be required by a particular application to operate at a particular voltage. Accordingly, the maximum number of available I/Os 212 that could be configured for a given operating voltage is a direct function of the number of power planes 240 in the flipchip package 200.

With an understanding of the problems associated with the wirebond package 100 of FIG. 1, it can be seen that the flipchip package 200 of FIG. 2 has similar problems. One problem with this conventional solution is that the number of I/Os 212 that can be supplied with a unique voltage is limited. Another problem is that if only some of the I/Os 212 in a given I/O segment 210 is required for a given operating voltage, the remaining unused I/Os 212 in that I/O segment 210 become wasted. Another problem is that the effective locations of the I/Os 212 that must operate at a particular voltage are fixed to a particular I/O segment 210, thus restricting a board layout. Finally, the number of power planes 240 in the flipchip package 200 is limited.

Generally, there is not a good solution to this problem today in that the known solutions have reduced flexibility in how I/Os can be configured for functionality and for power. To increase flexibility, a user must choose a package having more I/Os and voltage planes. Alternatively, the user must opt for a more expensive ASIC-based solution. These alternatives increase manufacturing costs.

Accordingly, what is needed is an improved system for implementing a configurable semiconductor device. The system should be flexible, optimal, simple, cost effective, and capable of being easily adapted to existing technology. The present invention addresses such a need.

SUMMARY OF THE INVENTION

The present invention provides a system for implementing a configurable integrated circuit (IC). Aspects of the invention include an IC die; a plurality of input/outputs (I/Os) coupled to the IC die; and a plurality power planes coupled to the IC die for providing power to the plurality of I/Os at different voltages. The plurality of power planes are each configured concentrically around the IC die so that any one or more of the I/Os at any location on the IC die can be individually configured to connect to any of the power planes. As a result, any number of I/Os available on the IC die can operate at a given voltage.

BRIEF DESCRIPTION OF THE DRAWINGS

FIG. 1 is a diagram of a conventional wirebond package.
FIG. 2 is a diagram of a conventional flipchip package.
FIG. 3 is a diagram of a wirebond package in accordance with one embodiment of the present invention.
FIG. 4 is a diagram of a flipchip package in accordance with another embodiment of the present invention.

DETAILED DESCRIPTION OF THE INVENTION

The present invention relates to semiconductor devices, and more particularly to a system for implementing a configurable integrated circuit. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

The present invention provides concentric power rings that provide power at different operating voltages to configurable I/Os on an IC die. The power rings are configured concentrically around the IC die so that any one or more of the I/Os at any location on the IC die can be individually configured to connect to any of the power planes. As a result, any number of I/Os available on the IC die can operate at a given voltage.

Although the present invention disclosed herein is described in the context of wirebond packages, and flipchip packages, and I/O devices, the present invention may apply to other types of packages and other types of integrated circuit devices, and still remain within the spirit and scope of the present invention.

FIG. 3 is a diagram of a wirebond package 300 in accordance with one embodiment of the present invention. The wirebond package 300 includes a die 302, core logic 304, I/O segments 310, I/Os 312, wire bonds 314, signal fingers 320, power connections 330, and concentric power rings 340. During a configuration operation, the I/Os 312 are configured to interface the core logic 304 with the environment external to the wirebond package 300.

The I/Os 312 are also configured to operate at certain operating voltages (e.g. 1.2V, 1.5V, 2.5V, and 3.3V) by being connecting, via the wire bonds 314 and the power connections 330, to the concentric power rings 340 depending on the required voltage. Alternatively, the I/Os 312 may be connected to the power rings 340s via a metal trace. For ease of illustration, not all of the wire bonds 314 that are connected to the power rings 340 are shown. Also, the wire bonds 314 that are connected to the signal fingers 320 are not shown.

Each power ring 340 supplies a unique operating voltage to one or more of the I/Os 312. Each of the power rings 340 are configured concentrically around the die 302 so that any one or more of the I/Os 312 at any location on the die 302 can be individually configured to connect to any of the power rings 340. As a result, any number of I/Os 312 available on the die 302 can operate at a given voltage. Although this embodiment of the present invention is described in the context of three concentric power rings 340, one of ordinary skill in the art will readily recognize that there could be any number of concentric power rings 340, their use would be within the spirit and scope of the present invention. Also, the actual shape of the power rings 340 may vary, depending on the specific application. For example, a power ring 340 can be polygonal, circular, oval, etc., and would be within the spirit and scope of the present invention.

According to the present invention, the physical locations of the concentric power rings 340 can be created on different layers of the die 302 and be connected to the appropriate I/Os 312 through metal interconnects.

The I/Os 312 are typically located around the die perimeter. Because of the concentric configuration of the power rings 340, all of the power rings 340 are in close proximity to all of the I/Os 312. Accordingly, each I/O 312 can be conveniently connected to any power ring 340 with short wire bonds 314. As a result, wire bond routing is simplified and power noise is minimized.

Furthermore, the I/Os 312 can be connected to any given power ring 340 individually or in an I/O segment 310. The I/O segments 310 connect to a given power ring 340 using a single power connection pad 314. The number of I/Os 312 in a given I/O segment 310 will vary, and the specific number will depend on the specific application. For example, an I/O segment 310 can include one or more I/Os 312 up to the total number I/Os 312 available on the die 302.

FIG. 4 is a diagram of a flipchip package 400 in accordance with another embodiment of the present invention. The flipchip package 400 includes a die 402, I/O segments 410, I/Os 412, metal traces 414, signal bumps 420, power connections 430, power bump rings 440, and power bumps 442. During a configuration operation, the I/Os 412 are configured to interface core logic (not shown) with the environment external to the flipchip package 400. The signal bumps 420 connect the I/Os 412 to signals or to discrete power in the external environment.

The I/Os 412 are also configured to operate at certain operating voltages by being connected via the metal traces 414 to one of the power bump rings 440 depending on the required voltage.

Each power bump ring 440 supplies a unique operating voltage to one or more of the I/Os 412. Each of the power bump rings 440 are configured concentrically around the die 402 so that any one or more of the I/Os 412 at any location on the die 402 can be individually configured to connect to any of the power bump rings 440. As a result, any number of I/Os 412 available on the die 402 can operate at a given voltage.

Although this embodiment of the present invention is described in the context of four concentric power bump rings 440, one of ordinary skill in the art will readily recognize that there could be any number of concentric power bump rings 440, and their use would be within the spirit and scope of the present invention. Also, the actual shape of a power bump ring 440 may vary, depending on the specific application. For example, a power bump ring can be polygonal, circular, oval, etc., and would be within the spirit and scope of the present invention.

According to the present invention, the physical locations of the concentric power bump rings 440 can be created on different layers of the die 402 and be connected to the appropriate I/Os 412 through metal interconnects.

The I/Os 412 are typically located around the die perimeter. Because of the concentric configuration of the power bump rings 440, all of the power bump rings 440 are in close proximity to all of the I/Os 412. Accordingly, each I/O 412 can be conveniently connected to any power bump ring 412 with short metalized traces. As a result, metal trace routing is simplified and power noise is minimized.

Furthermore, the I/Os 412 can be connected to any given power bump ring 440 individually or in an I/O segment 410. The I/O segments 410 can connect to a given power bump ring 440 using a single power connection pad 430. The number of I/Os 412 in a given I/O segment 410 will vary, and the specific number will depend on the specific application. For example, an I/O segment 410 can include one or more I/Os 412 up to the total number I/Os 412 available on the die 402.

According to the system disclosed herein, the present invention provides numerous benefits. For example, the number of I/Os that could be independently configured for a given operating voltage is not limited by the number power rings or power bump rings in a given package. This maximizes the number of I/Os that can operate at a given operating voltage. This also minimizes the number of I/Os that are wasted since I/Os can be conveniently powered by a given voltage ring individually or in varying sized groups. Embodiments of the present invention enable simple, flexible, and optimal configuration of I/Os as well as an overall system design. This reduces circuit board costs, design time, and development time.

A system for implementing a configurable integrated circuit has been disclosed. The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

We claim:

1. A system for implementing a configurable integrated circuit (IC), the system comprising:

an IC die;

a plurality of input/outputs (I/Os) coupled to the IC die; and a plurality of power planes coupled to the IC die for providing power to the plurality of I/Os at different voltages, wherein the plurality of power planes are each configured concentrically around the IC die so that any one or more of the I/Os at any location on the IC die can be individually configured to connect to any of the power planes, wherein each power plane is configured as a ring, wherein the ring is polygonal.

2. The system of claim 1 wherein each power plane is configured as a ring of power bumps.

3. The system of claim 1 wherein any number of I/Os can be configured to connect to any one power plane.

4. The system of claim 1 further comprising a plurality of I/O segments coupled to the plurality power planes, wherein each I/O segment comprises a plurality of I/Os, and wherein the number of I/Os an I/O segment can vary from I/O segment to I/O segment.

5. The system of claim 1 wherein concentric power planes are on different layers of the die and connected to the I/Os through metal interconnects.

6. A wirebond package comprising:

an IC die;

a plurality of input/outputs (I/Os) coupled to the IC die; and a plurality of power rings coupled to the IC die for providing power to the plurality of I/Os at different voltages, wherein each the plurality of power rings are configured concentrically around the IC die so that any one or more of the I/Os at any location on the IC die can be individually configured to connect to any of the power rings, wherein the power ring is polygonal.

7. The wirebond package of claim 6 wherein any number of I/Os can be configured to connect to any one power ring.

8. The wirebond package of claim 6 further comprising a plurality of I/O segments coupled to the plurality power rings, wherein each I/O segment comprises a plurality of I/Os, and wherein the number of I/Os an I/O segment can vary from I/O segment to I/O segment.

9. The wirebond package of claim 6 wherein concentric power rings are on different layers of the die and connected to the I/Os through metal interconnects.

10. The system of claim 1 wherein the IC Die and at least one of the I/Os is disposed within a flipchip package.

* * * * *